United States Patent [19]

Mitsui

[11] 3,963,977

[45] June 15, 1976

[54] FREQUENCY MULTIPLIER WITH NONLINEAR SEMICONDUCTOR ELEMENT

[75] Inventor: Shigeru Mitsui, Amagasaki, Japan

[73] Assignee: Mitsubishi Denki Kabushiki Kaisha, Japan

[22] Filed: Dec. 23, 1974

[21] Appl. No.: 535,022

Related U.S. Application Data

[63] Continuation of Ser. No. 345,591, March 28, 1973, abandoned.

[30] Foreign Application Priority Data

Mar. 31, 1972 Japan.............................. 47-32207

[52] U.S. Cl............................ 321/69 NL; 307/300
[51] Int. Cl.²......................................... H02M 5/20
[58] Field of Search............... 321/69 NL; 307/228, 307/300, 303; 323/93

[56] References Cited
UNITED STATES PATENTS

| | | | |
|---|---|---|---|
| 2,927,221 | 3/1960 | Armstrong........................... | 307/228 |
| 3,093,752 | 6/1963 | Christensen..................... | 321/69 NL |
| 3,808,515 | 4/1974 | Davis et al............................ | 323/93 |

*Primary Examiner*—Gerald Goldberg
*Attorney, Agent, or Firm*—Robert E. Burns; Emmanuel J. Lobato; Bruce L. Adams

[57] ABSTRACT

A semiconductive body in the form of a rectangular parallelepiped is formed of a semiconductive material, such as gallium arsenide or indium phosphide or Group IV elements, having an electric field-to-current characteristic either including a nonlinear region, such as a negative resistance region; or nonlinear and partly including a saturated region. A dc biasing electric field is applied across two opposite faces of the substrate while an ac input electric field is applied across two opposite faces perpendicular to the first faces of the semiconductive body to form a resultant electric field variable in a portion of the characteristic including the nonlinear or saturated region. This variation in the resultant field causes a current component flowing in the direction of the biasing field through the body to have a frequency equal to a multiple of that of the ac input field.

8 Claims, 8 Drawing Figures

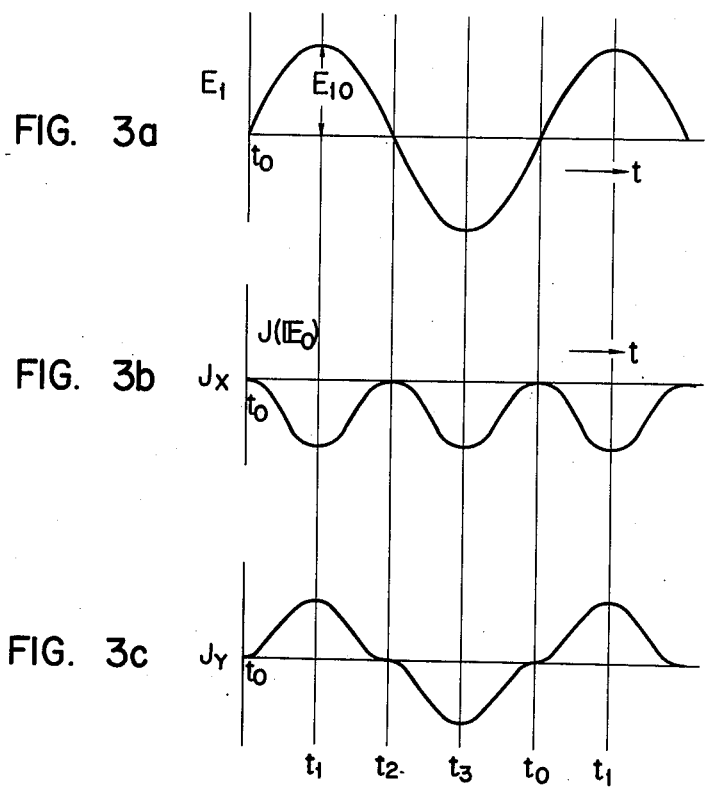
FIG. 3a
FIG. 3b
FIG. 3c
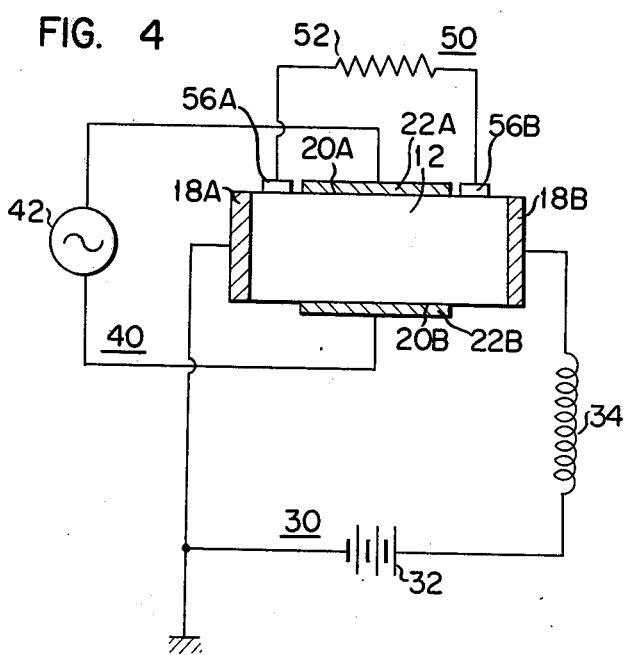
FIG. 4

FREQUENCY MULTIPLIER WITH NONLINEAR SEMICONDUCTOR ELEMENT

This is a continuation of application Ser. No. 345,591, filed Mar. 28, 1973, now abandoned.

BACKGROUND OF THE INVENTION

This invention relates to a frequency multiplier device, and more particularly to a frequency multiplier device using a semiconductor element to multiply a frequency of an alternating current signal.

Conventional semiconductor frequency multiplier devices have used the semiconductor device including only a pair of electrodes or terminals and typically the semiconductor diode called "VARACTOR" (trade mark) to use in parametric amplification. Such a diode includes a single pair of electrodes or terminals disposed on a pair of main opposite faces of its semiconductive body including a p-n junction and has a nonlinear electric field-to-current characteristic developed between that pair of electrodes or terminals. The nonlinear electric field-to-current characteristic as it stands has been utilized to multiply a frequency of an alternating current (ac) signal applied to the diode. More specifically, an ac signal has been applied across the electrodes on the diode to form an output signal including different harmonic components. Then by using a special filter, only that harmonic component multiplied in frequency as desired has been taken out from the output signal. In such conventional devices, the output signal has been developed across the same electrodes across which input signal has been applied. In other words, the pair of electrodes have been necessarily used not only to supply the input signal thereacross but also to take out the output signal therefrom. Thus it has been difficult to separate the output signal from the input signal and therefore to use such conventional frequency multiplier devices. In addition, the conventional devices have been required to be operatively associated with a special filter or filters in order to take out a desired harmonic component from the output signal resulting in the complication of the constructions thereof.

Accordingly it is an object of the present invention to provide a new and improved semiconductor frequency multiplier device for easily separating an output signal from a corresponding input signal applied thereto with a simple construction.

SUMMARY OF THE INVENTION

The present invention provides a semiconductor frequency multiplier for multiplying a frequency of an electrical signal comprising, in combination, a body of semiconductive material having an electric field-to-current characteristic including a nonlinear region, biasing means for establishing a biasing electric field in a first direction within the body, input means for establishing an alternating current input electric field in a second direction substantially orthogonal to the first direction within the body, and output means for taking out a current component flowing in the first direction through the body, the arrangement being such that the biasing electric field and the alternating current electric field form a resultant electric field variable in a portion of the electric field-to-current characteristic including the nonlinear region in response to a change in the ac input electric field, and the current components taken out by said output means has a frequency equal to a multiple of the frequency of the ac input electric field.

The semiconductive body may be preferably formed of gallium arsenide (GaAs).

The body may also be made of a semiconductive material having an electric field-to-current characteristic nonlinear and partly including a saturated region, for example, of silicon or germanium.

BRIEF DESCRIPTION OF THE DRAWINGS

The present invention will become more apparent from the following detailed description taken in conjunction with the accompanying drawings in which:

FIGS. 3a, 3b and 3c are graphs illustrating waveforms developed at various points in the arrangement shown in FIG. 1; and FIG. 4 is a circuit diagram similar to FIG. 1 but illustrating a modification of the present invention.

DESCRIPTION OF THE PREFERRED EMBODIMENTS

Figure 1:
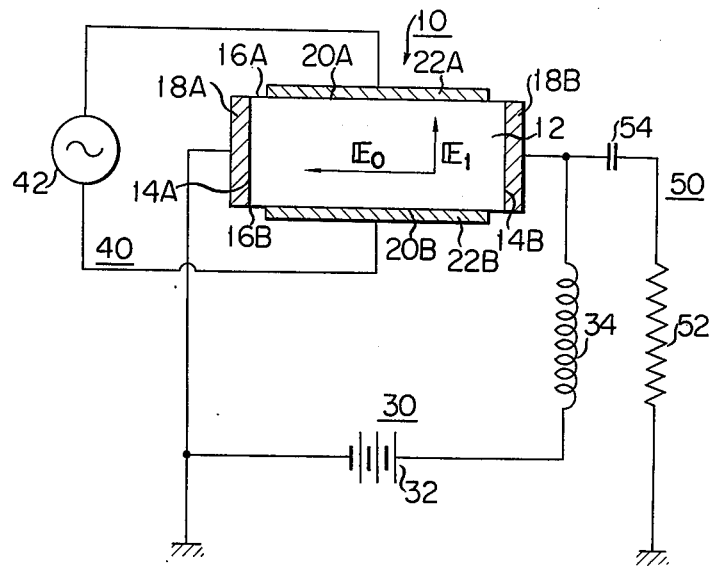
FIG. 1 is a circuit diagram of a semiconductor frequency multiplier device constructed in accordance with the principles of the present invention with a semiconductor device involved schematically shown in section.

Referring now to FIG. 1 of the drawings, it is seen that an arrangement disclosed herein comprises a semiconductor device generally designated by the reference numeral 10 including a substrate or a body 12 of semiconductive material in the form of a rectangular parallelepiped having an electric field-to-current characteristic exhibiting a non-linearity due to the bulk effect. Such semiconductive materials can be generally sorted into two types, one of which involves semiconductive materials exhibiting the Gunn effect, for example, III–V compounds such as gallium arsenide (GaAs), indium phosphide (InP) etc. Those semiconductive materials have the electric field-to-current characteristic including a negative resistance region. The other type of semiconductive materials exhibit a current saturation effect in the high electric field and involves semiconductive IV elements such as silicon (Si), germanium (Ge) etc. The present invention is equally applicable to the two types of semiconductive materials as above described.

In the example illustrated, the semiconductive body 12 is formed of n type gallium arscenide (GaAs) having an n type impurity uniformly doped therein to a carrier concentration of $10^{14}$ atoms per $cm^3$ only for purposes of illustration. The body 12 includes a first pair of parallel faces 14A and 14B opposite to and spaced away from each other in the lengthwise direction thereof called a first direction hereinafter and a second pair of parallel faces 16A and 16B opposite to and spaced away from each other in the direction of thickness thereof called a second direction that is substantially orthogonal to the first direction.

The faces 14A and 14B have a pair of opposite electrodes 18A and 18B disposed in ohmic contact therewith respectively while the faces 16A and 16B have a pair of opposite films 20A and 20B of any suitable electrically insulating material such as silicon dioxide or silicon nitride disposed thereon, and a pair of opposite electrodes 22A and 22B disposed on the respective insulating films 20A and 20B.

As shown in FIG. 1, a biasing circuit generally designated by the reference numeral 30 includes a source 32 of direct current having a positive end connected to the electrode 14B through an inductor 34 and a negative end connected to the electrode 14A and also to ground thereby to establish a biasing electric field $E_o$ in the first direction within the body 12.

Also an input circuit generally designated by the reference numeral 40 include a source 42 of alternating current signal connected across the electrodes 22A and 22B to establish an alternating current input electric field $E_1$ in the second direction within the body 12. Only for purposes of illustration, it is assumed that the signal source 42 produces an alternating current signal having a sinusoidal waveform. In the assumed condition, the alternating current input electric field $E_1$, may be expressed by $$E_1 = E_{10}\sin wt$$

where $E_{10}$ is an amplitude of the signal and $w$ is an angular velocity thereof. However it is to be understood that the present invention is equally applicable to an alternating current signal having any desired waveform other than a sinusoidal waveform.

Further the semiconductor device 10 is connected to an output circuit generally designated by the reference numeral 50 by having the electrode 18B connected to one end of an output resistor 52 through a blocking capacitor 54 with the other end of the resistor 52 connected to ground.

Figure 2A:
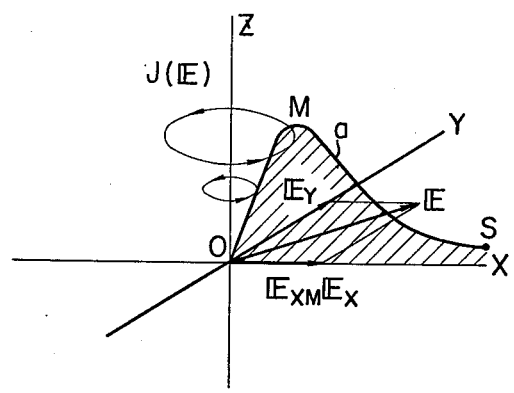
FIGS. 2a, 2b and 2c are graphs useful in explaining the operation of the arrangement shown in FIG. 1.

The operation of the arrangement as shown in FIG. 1 will now be described with reference to FIGS. 2 and 3. FIG. 2a shows the relationship between an resultant electric field E composed of the biasing field $E_o$ and input field $E_1$ and a current flowing through the body 12 formed of n type gallium arsenide as above described. In FIG. 2a a three dimensional orthogonal coordinate system is shown having the X and Y axes coinciding with the first and second directions as above defined with respect to the body 12, and the Z axis representing a current flowing through the body 12. The resultant field E has an X component of $E_X$ corresponding to the particular biasing field $E_o$ and a Y component of $E_Y$ corresponding to the particular input field $E_1$.

It is assumed that the resultant field E is directed toward the X axis, that is, the input field $E_1$ is absent. Under the assumed condition, curve $a$ as shown in FIG. 2a describes the relationship between the strength $|E|$ of the resultant field E and a current $J(E)$ flowing through the body 12. As the strength $|E|$ of the resultant field increases from a zero, the current increases from a zero until it reaches a maximum magnitude shown by point M on curve $a$ corresponding to a strength $E_{XM}$ of the resultant field. Thereafter, the current decreases with an increase in magnitude $|E|$ of the field. A further increase in strength $|E|$ causes the current to reach its saturated magnitude as shown by point S on curve $a$. Therefore, it will be appreciated that the electric field-to-current characteristic represented by curve $a$ has a positive resistance region ranging from the origin O to point M and a negative resistance region ranging from point M to point S, which characteristic is well known.

Figure 2B:
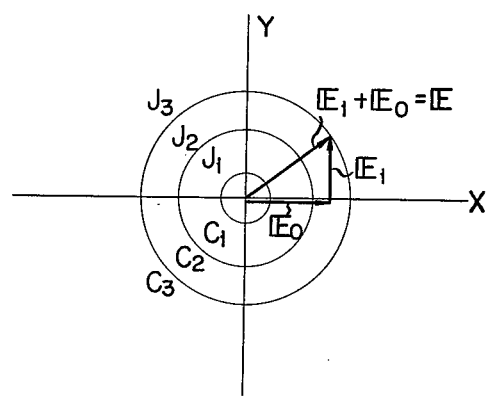

While curve $a$ represents the field-to-current characteristic exhibited when the field E is applied to the body along the X axis it will readily be understood that the application of the field E in any direction in the XY plane causes the resulting characteristic represented by a curve identical to the curve $a$ in that direction. One complete revolution of the direction of the applied field in the XY plane about the origin O as shown at the arrowed circles about the Z axis in FIG. 2a causes a composite field-to-current characteristic about the Z axis described by a curved surface generated by the curve $a$ rotated about the Z axis resembling in shape a crater of a volcano. FIG. 2b shows a contour diagram of the composite characteristic as viewed in the XY plane. In FIG. 2b, each of concentric circles is a locus of points on the generated curved surface where the current has a common fixed magnitude. For example, a circle $C_2$ is a locus of points labelled M on the curve $a$ shown in FIG. 2a where the current has a maximum magnitude of $J_2$. In other words, the circle $C_2$ shows points on the curved surface where a maximum magnitude of the current is given. Circles $C_1$ and $C_3$ smaller and larger in radius than the circle $C_2$ respectively give points where the currents have magnitudes of $J_1$ and $J_3$ less than the magnitude of $J_2$. It will readily be understood that the curved surface has a radial section such as shown by the hatched portion in FIG. 2a.

It is now assumed that the substrate 12 has a biasing electric field $E_o$ applied thereto along the X axis and having a magnitude less than the abovementioned magnitude of $E_{XM}$ and that an alternating current input electric field $E_1$ is being applied to the body 12 so as to be orthogonal to the biasing field. Under the assumed condition the resultant electric field E established in the body 12 is equal to the sum of both fields or $E_o + E_1$. Those three electric field $E_o$, $E_1$ and E are also shown in FIG. 2b. The field E is responsive to a change in the alternating current field $E_1$ to change in the negative resistance region of the field-to-current characteristic as above described.

The manner in which the current J is varied in response to a change in the alternating current input electric field $E_1$ will now be described in conjunction with FIGS. 2 and 3. FIG. 3a shows a change in the strength $|E_1|$ of the alternating current field $E_1$ plotted against time $t$, and FIG. 3b shows a variation in a current component $J_X$ flowing along the X axis through the substrate with respect to time $t$ and in synchronization with the change in the alternating current field $E_1$. FIG. 3c is a graph similar to FIG. 2b but illustrating a current component $J_Y$ flowing along the Y axis through the body.

Assuming that the field $E_1$ has a zero magnitude at a time point $t_o$, only the field $E_o$ is effective. At that time the current components $J_X$ has a reference strength of $J(E_o)$. A current having that reference magnitude $J(E_o)$ is shown by $J(E_o)$ in FIG. 2c. As shown at waveform $E_1$ in FIG. 3a, the strength of the field $E_1$ is gradually increased with a first polarity, in this case, the positive polarity which is accompanied by a gradual increase in the strength of the resultant field E as will readily be understood from the illustration of FIG. 2b. Also it should be understood that a gradual increase in the strength $|E|$ of the field E causes a gradual decrease in a current flowing through the body in the direction of the field E. This is because the biasing field $E_o$ has a strength higher than the strength $E_{XM}$ corresponding to the maximum magnitude $J_2$ of the current. As the input field E increases in strength, the resultant field E has its strength gradually higher than the strength $|E_o|$ of the field $E_o$. This means that the current flowing in the direction of the field E can have magnitudes given circles gradually larger in radius such as shown in FIG. 2b. FIG. 2b shows the particular field $E_1$ causing the current just given a point on the circle $C_3$ to flow in the direction of the field E.

Figure 2C:
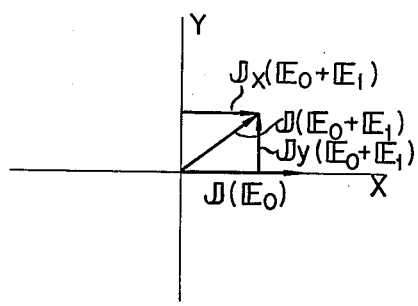

In FIG. 2c, a vector $J(E_o + E_1)$ designates a current flowing in a direction of a field E or $E_o + E_1$ and it is seen that the current $J(E_o + E_1)$ is less in magnitude than the current $J(E_o)$.

It will readily be understood that the current $J(E_o + E_1)$ can be resolved into a current component $J_X(E_o + E_1)$ flowing in the direction of the X axis and a current component $J_Y(E_o + E_1)$ following in the direction of the Y axis. Also it will readily be understood that the X component $J_X(E_o + E_1)$ is less in the magnitude than the Y component $J_Y(E_o + E_1)$.

As apparent from FIG. 3, the X component $J_X$ of the current I reaches a minimum magnitude at a time point $t_1$ when the field $E_1$ has a peak strength $E_{10}$ with the first or positive polarity. As the field $E_1$ is gradually decreased after the time point $t_1$, the current component $J_X$ is gradually increased until the current component is again returned back to its reference magnitude $J(E_o)$ at a time point $t_2$ when the field $E_1$ becomes null. Then the field $E_1$ is gradually increased with a second or the negative polarity. This increase in the field $E_1$ causes a gradual decrease in the current component $J_X$. At a time point $t_3$ when the field $E_1$ reaches a maximum strength with the second polarity, the current component $J_X$ has again a minimum magnitude. Following this, the field E again reaches a zero strength at a time point $t_o$ whereupon the current component $J_X$ restores its reference magnitude $J(E_o)$.

From the foregoing it will be appreciated that during each cycle of the field $E_1$ the current component $J_X$ goes through two complete cycles thereof. That is, the current component $J_X$ has a frequency equal to twice the frequency of the input field $E_1$. On the other hand, the current component $J_Y$ is identical in frequency to the input field $E_1$ as shown in FIG. 2.

The reference magnitude $J(E_o)$ for the current component $J_X$ is of the direct current type and blocked by the blocking capacitor 54. Thus, the load or resistor 52 has only an alternating current portion of the current component $J_X$ flowing therethrough. This is, the input signal from the source 42 applied across the electrodes 22A and 22B is taken out from the resistor 52 as an output signal doubled in frequency. In the arrangement of FIG. 1, the inductor 34 serves to prevent the alternating current portion of the current component $J_X$ from flowing into the bias source 32.

In the arrangement of FIG. 1 it is to be noted that the input signal is applied across the electrodes 22A and 22B while the output signal is taken out from across the electrodes 18A and 18B. The arrangement is effective for separating the output signal from the input signal in a simple manner. In addition, a desired output signal can be easily taken out from the resistor 52 only by blocking the direct current portion of the current component $J_X$ by the blocking capacitor 54 as above described.

According to the principles of the present invention it is possible to cause the strength of the biasing field $E_o$ to be smaller than the strength $E_{XM}$ corresponding to the maximum magnitude $J_2$ of the current. To this end, the input field $E_1$ is selected to have such an amplitude that the strength of the field E causes the current to go over the maximum magnitude thereof and then further decrease. In other words, the amplitude of the input field E is selected so as to vary the current $J(E_o + E_1)$ over a range of from the positive resistance region to the negative resistance region of the electric field-to-current characteristic. This measure permits the current component $J_X$ to change from its reference magnitude through its maximum current point and thence to its reference magnitude during a time period for which the field $E_1$ changes from a zero strength to its peak strength, that is, during a quarter of one complete cycle thereof. Therefore the resulting output signal includes the main components having a frequency equal to four times the frequency of the input signal.

It has been found that the similar frequency multiplication such as above described is accomplished with the semiconductor body 12 formed of the second type of semiconductive materials having the field-to-current characteristic nonlinear and partly including a saturated region. For such semiconductive materials, an operating region ranging from a region beginning to saturate the current to the saturated region can be effectively utilized to perform the operation of multiplying the frequency. In the saturated region, an increase in the strength of the input field $E_1$ is accompanied by an increase in the strength of the resultant field while the corresponding current tends to be scarcely increased. If it is assumed that the current $J(E_o)$ is substantially equal in magnitude to the current $J(E_o + E_1)$ in FIG. 2c then the current component $J_X(E_o + E_1)$ will become small as compared with the current $J(E_o)$. Therefore with the resultant field E varied in accordance with the input field $E_1$ in such a saturated region, the current component $J_X$ is possible to effect the change of one complete cycle during one half cycle of the field $E_1$. That is, the current component $J_X$ has a frequency equal to twice that of the input field $E_1$.

FIG. 4 wherein like reference numerals designate the components identical to those shown in FIG. 1, illustrates a modification of the present invention. A pair of output electrodes 56A and 56B are disposed in ohmic contact with the surface 16A of the body 12 on both sides of the input electrode 22A and spaced away therefrom. Then the resistor or load 52 is connected across the output electrodes 56A and 56B with the blocking capacitor 54 omitted. In other respects, the arrangement is identical to that shown in FIG. 1. Since the electrodes 56A and 56B are isolated from each other in the first direction as previously described, a current component $J_X$ flowing in the first direction or in the direction of the X axis through the body 12 can be supplied to the load 52.

If desired, the electrodes 56A and 56B may be disposed on the surface 14A of the body 12 through the dielectric film 20A.

While the invention has been illustrated and described in conjunction with a few preferred embodiments thereof it is to be understood that numerous changes and modifications may be resorted to without departing from the spirit and scope of the invention. For example, means for applying the alternating current input field $E_1$ across the body 12 may be differently changed. As an example, the body 12 may be disposed in a section of any suitable waveguide to be applied with an input electric field $E_1$ established therein. In that event, the electrodes 22A, 22B and the dielectric films 20A, 20B are omitted. Also the electrodes 22A and 22B may be disposed in ohmic contact with the both surfaces 16A and 16B of the body 12 with the dielectric films 20A and 20B omitted. Further, the electrodes 22A and 22B may be disposed on the body 12 through individual Schottky barriers or n—n junctions, respectively. In addition, the first and second direction as previously described are not required to be exactly orthogonal to each other and may be materially orthogonal to each other for practical purposes.

What is claimed is:

1. A semiconductor device for multiplying a frequency of an applied electrical signal, comprising, in combination, a body of semiconductive material having a single conductivity type throughout and having an electric field-to current characteristic including a nonlinear region, biasing means comprising a first pair of electrodes in ohmic contact with said body and spaced in a first direction for establishing a biasing electric field in said first direction within said body, input means receptive in use of an alternating signal and coupled to said body for establishing an alternating input electric field in a second direction substantially orthogonal to said first direction within said body, said input means comprising a pair of dielectric films and a second pair of electrodes spaced in said second direction and disposed on said body with a respective one of said dielectric films disposed between each of the electrodes comprising said second pair and said body, and output means in ohmic contact with said body for providing a current component flowing in said first direction through said body, said output means comprising a third pair of electrodes spaced in said first direction and disposed on a surface of said body having one of the electrodes comprising said second pair disposed thereon, said biasing electric field and said alternating electric field forming a resultant time-varying electric field variable in at least said nonlinear region of the electric field-to-current characteristic in response to variations in said alternating input electric field whereby said current component provided by said output means has a frequency equal to a multiple of the frequency of said alternating input electric field.

2. A semiconductor frequency multiplier device as claimed in claim 1, wherein said semiconductive material of said body has a negative resistance region in the electric field-to-current characteristic thereof and said resultant electric field is variable in at least said negative resistance region of the electric field-to-current characteristic.

3. A semiconductor frequency multiplier device as claimed in claim 2, wherein said body is formed of a semiconductive material exhibiting the Gunn effect.

4. A semiconductor frequency multiplier device as claimed in claim 2, wherein said body is formed of gallium arsenide (GaAs).

5. A semiconductor frequency multiplier device as claimed in claim 2, wherein said resultant electric field is varied in said negative resistance region to cause said output means to take out a current component having a frequency equal to twice the frequency of said alternating current input electric field.

6. A semiconductor frequency multiplier device as claimed in claim 1, wherein said semiconductive material of said body has both a positive resistance region and a negative resistance region in the electric field-to-current characteristic thereof and said resultant electric field is varied in a portion of the electric field-to-current characteristic including said positive and negative resistance regions of the electric field-to-current characteristic to cause said output means to take out a current component having a frequency equal to four times the frequency of said alternating current input electric field.

7. A semiconductor frequency multiplier device as claimed in claim 1, wherein said first pair of electrodes have connected thereacross a direct current bias circuit for establishing said biasing electric field in said body.

8. A semiconductor frequency multiplier device as claimed in claim 1, wherein said body is in the form of a rectangular parallelepiped and said first pair of electrodes are disposed on a pair of parallel faces opposite to each other in said first direction of said rectangular parallelepiped to impart said biasing electric field to said body and said second pair of electrodes are disposed on another pair of parallel faces opposite to each other in said second direction of said rectangular parallelepiped to impart said alternating current input electric field to said body.

* * * * *